(12) United States Patent
Sako

(10) Patent No.: US 6,459,319 B2
(45) Date of Patent: Oct. 1, 2002

(54) VARIABLE DELAY CIRCUIT AND SEMICONDUCTOR INTEGRATED CIRCUIT HAVING THE SAME

(75) Inventor: Atsumasa Sako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/843,818

(22) Filed: Apr. 30, 2001

(30) Foreign Application Priority Data

May 26, 2000 (JP) .................................. 2000-156843

(51) Int. Cl.[7] .............................................. H03H 11/26
(52) U.S. Cl. .................... 327/276; 327/277; 327/278; 327/269; 327/393; 327/396
(58) Field of Search ................................ 327/276, 277, 327/278, 284, 285, 269, 270, 271, 392, 393, 396, 397

(56) References Cited

U.S. PATENT DOCUMENTS

| 5,389,843 A | * | 2/1995 | McKinney | 327/276 |
|---|---|---|---|---|
| 5,446,417 A | * | 8/1995 | Korhonen et al. | 331/57 |
| 5,502,672 A | * | 3/1996 | Kwon | 365/189.05 |
| 5,668,491 A | * | 9/1997 | Higashisaka et al. | 327/277 |
| 5,727,021 A | * | 3/1998 | Truebenbach | 375/226 |
| 5,821,793 A | * | 10/1998 | Ohta et al. | 327/277 |
| 5,963,074 A | * | 10/1999 | Arkin | 327/276 |

* cited by examiner

*Primary Examiner*—Timothy P. Callahan
*Assistant Examiner*—An T. Luu
(74) *Attorney, Agent, or Firm*—Arent Fox Kintner Plotkin & Kahn, PLLC

(57) ABSTRACT

The variable delay circuit has a delay circuit and a selector. The delay circuit is formed of a plurality of delay stages connected in cascade. The delay circuit receives an input signal at the initial delay stage and respectively outputs a delayed signal which is the input signal delayed, from the delay stages. The selector receives the delayed signals and selecting signals respectively corresponding to the delayed signals. The selector selects the delayed signal corresponding to an activated selecting signal and outputs the selected signal as a delayed output signal. The delay stage(s) subsequent to the delay stage outputting the delayed signal selected by the selector is/are inactivated. Not operating unnecessary delay stages can prevent wasteful power consumption.

7 Claims, 7 Drawing Sheets

VARIABLE DELAY CIRCUIT AND SEMICONDUCTOR INTEGRATED CIRCUIT HAVING THE SAME

BACKGROUND OF THE INVENTION

1. Field of the Invention

The present invention relates to a variable delay circuit which is capable of setting delay time to a predetermined value. Especially, this invention relates to a technology for reducing power consumption of the variable delay circuit.

2. Description of the Related Art

FIG. 1 shows a variable delay circuit of the prior art.

The variable delay circuit has a delay circuit 2 in which delay stages. 2a are connected in cascade and a selector 4. The delay circuit 2 receives an input signal IN at the initial delay stage 2a and outputs delayed signals DT1, DT2, ..., DTn-1, DTn from each of the delay stages 2a, respectively. Hereinafter, the delayed signals DT0 to DTn are also referred to as the delayed signal DT, collectively. The selector 4 receives the delayed signals DT0, DT1, ..., DTn-1, DTn and selecting signals SS0, SS1, ..., SSn-1, SSn which correspond to the delayed signals DT like the above, respectively. Hereinafter, the selecting signals SS0 to SSn are also referred to as the selecting signal SS, collectively. The selecting signals SS are outputted from a not-shown control circuit and any of these is activated. The selector 4 selects the delayed signal DT which corresponds to the activated selecting signal SS and outputs the selected delayed signal DT as a delayed output signal OUT. As a result, the variable delay circuit operates as the circuit which delays the input signal IN by a predetermined time according to the selecting signal SS.

Note that, when the aforesaid variable delay circuit receives a change of the input signal IN, it transmits the change of the input signal IN by successively operating all of the delay stages 2a. For example, when the selector 4 receives the activation of the selecting signal SS1 to select the delayed signal DT1, the delay stages 2a subsequent to the delay stage 2a which outputs the delayed signal DT1 successively output the delayed signal DT2, DT3, ..., DTn. Thus, the variable delay circuit of the prior art has a problem of wastefully consuming power because the unnecessary delay stages 2a are operated. Especially, when increasing a change amount of delay time or setting the delay time at smaller intervals, it is necessary to increase the delay stages 2a in number, in which case the power consumption of the variable delay circuit is increased.

SUMMARY OF THE INVENTION

It is an object of the present invention to reduce power consumption of a variable delay circuit which is capable of setting a predetermined delay time.

According to one aspect of the present invention, the variable delay circuit has a delay circuit and a selector. The delay circuit is formed of a plurality of delay stages connected in cascade. The delay circuit receives an input signal at the initial delay stage and respectively outputs a delayed signal which is the input signal delayed, from the delay stages. The selector receives the delayed signals and selecting signals respectively corresponding to the delayed signals. The selector selects the delayed signal corresponding to an activated selecting signal and outputs the selected delayed signal as a delayed output signal. The delay stage(s) subsequent to the delay stage outputting the delayed signal selected by the selector is/are fixed (inactivated). Not operating unnecessary delay stages can prevent wasteful power consumption.

According to another aspect of the present invention, each of the delay stages has a disable terminal for stopping its operation upon receiving activation of the selecting signal corresponding to the delayed signal supplied from the previous delay stage. Further, the delay stage receiving the activated selecting signal at the disable terminal is fixed (inactivated). Since the delay stage(s) subsequent to the inactivated delay stage stop(s) its operation, wasteful power consumption can be avoided. Moreover, unnecessary delay stages are inactivated by receiving, at the disable terminal, the selecting signal used in the selector so that the variable delay circuit with low power consumption can be easily structured.

According to still another aspect of the present invention, a semiconductor integrated circuit has an adjusting circuit for adjusting an operation timing of an internal circuit. The adjusting circuit has an activation control circuit for activating any of the selecting signals. Further, the activation control circuit activates any of the selecting signals so that the delayed output signal which is the input signal delayed by a predetermined time is outputted from the variable delay circuit, thereby adjusting the operation timing of the internal circuit. Namely, an operation margin of the internal circuit is evaluated.

According to another aspect of the present invention, the adjusting circuit in the semiconductor integrated circuit has a fuse circuit for activating any of the selecting signals by blowing a fuse and a selecting circuit for validating either an activation of the selecting signal by the activation control circuit or an activation of the selecting signal by the fuse circuit. In this semiconductor integrated circuit, the selecting circuit first switches from the fuse circuit to the activation control circuit to operate the internal circuit, whereby the delayed output signal to be output at an optimal timing is determined. Next, the selecting circuit switches from the activation control circuit to the fuse circuit, and a predetermined fuse in the fuse circuit is blown so that the delayed output signal is always outputted at an optimal timing from the variable delay circuit. Namely, trimming the delayed output signal is carried out.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the preferred embodiments of the present invention will be explained with reference to the drawings.

Signal lines shown by bold lines in the respective drawings mean that each of these is structured by a plurality of the lines. Moreover, a part of a circuit to which the bold line is connected is structured by a plurality of components. The same numerals are given to the same circuits/signals with the circuits which are explained in the description of the related art, and detailed explanations thereof are omitted.

Figure 1:
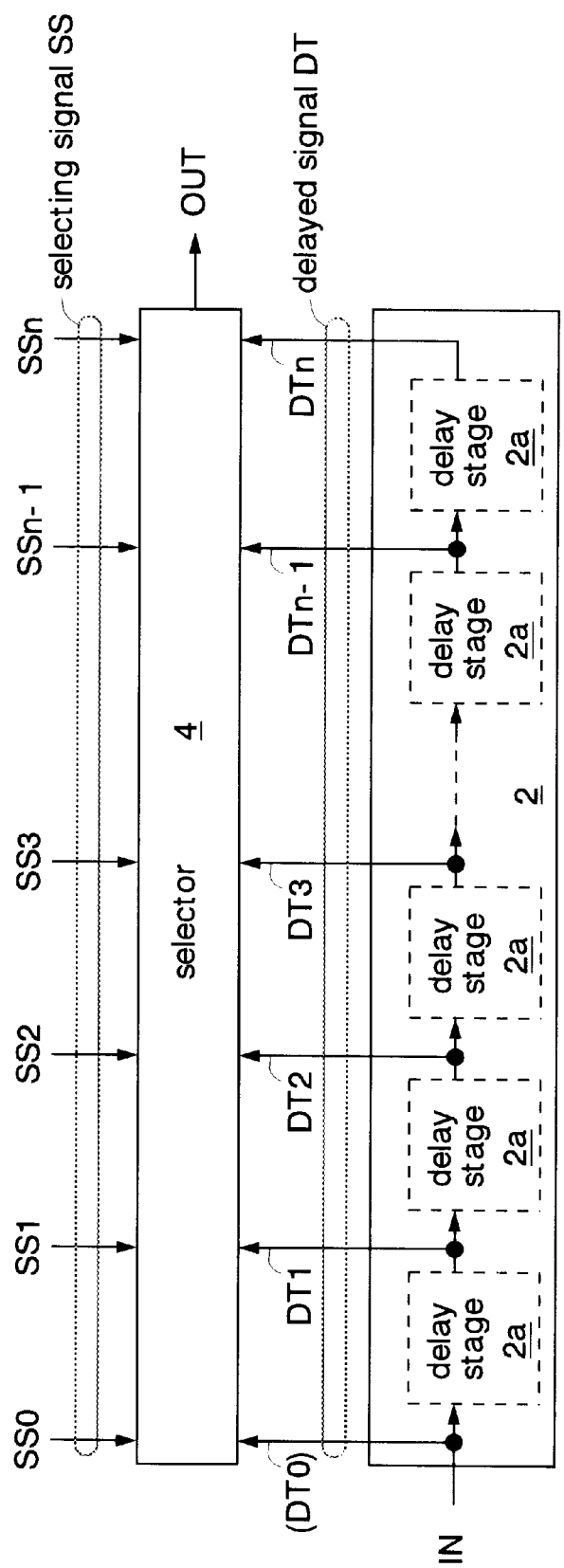
FIG. 1 is a block diagram showing a variable delay circuit of the prior art.
Figure 2:
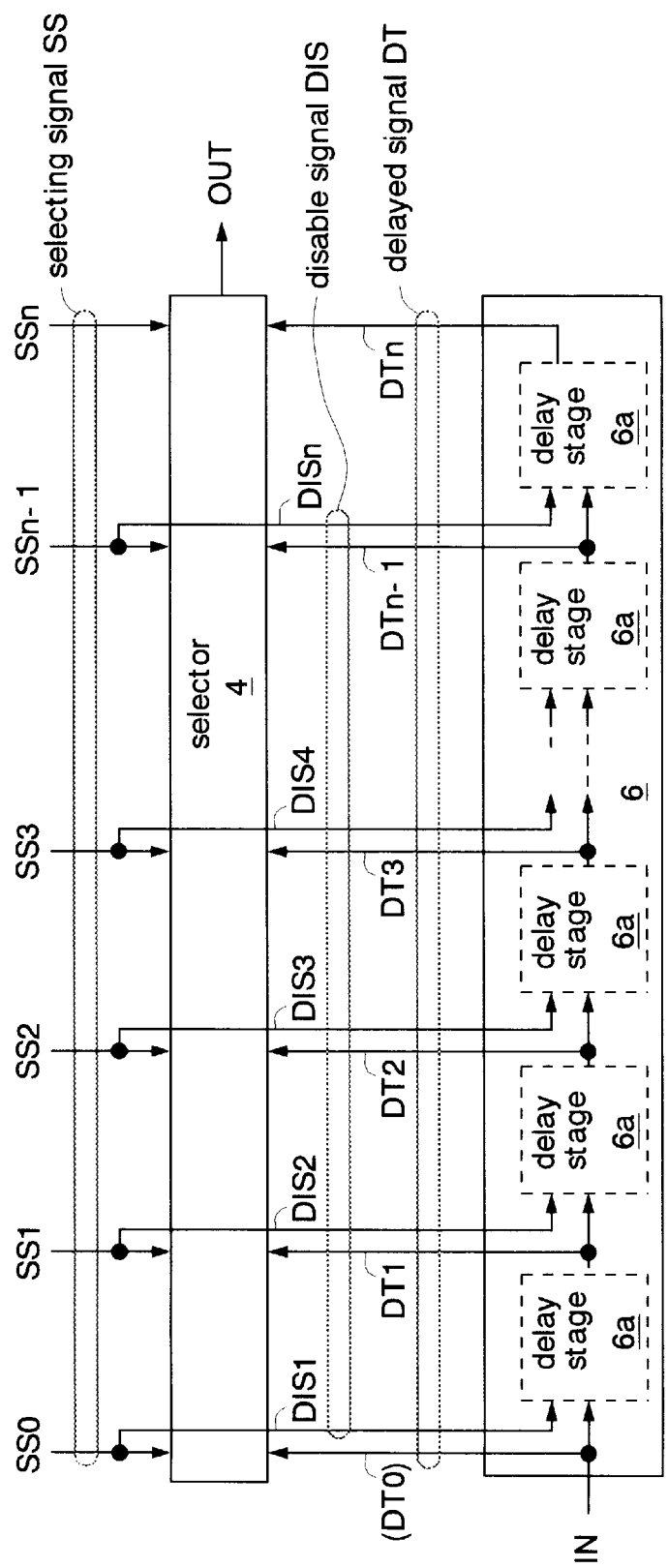
FIG. 2 is a block diagram showing a basic principle of a variable delay circuit according to the present invention.

FIG. 2 is a block diagram showing a basic principle of a variable delay circuit according to the present invention.

The variable delay circuit has a delay circuit 6 in which a plurality of delay stages 6a are connected in cascade, and a selector 4. The delay circuit 6 receives an input signal IN at the initial delay stage 6a, and outputs delayed signals DT1, DT2, . . . , DTn−1, DTn from each of the delay stages 6a, respectively. Each delay stage 6a receives a selecting signal SS which corresponds to the delayed signal DT supplied from the previous stage as a disable signal DIS (DIS1, DIS2, . . . , DISn) at a disable terminal (not shown). The selector 4 is the same circuit as the prior art. The selector 4 selects the delayed signals DT0 to DTn which correspond to the activated selecting signals SS0 to SSn and outputs the selected delayed signal DT as a delayed output signal OUT. The selecting signals SS0 to SSn are outputted from a not-shown control circuit and any of these is activated.

In the variable delay circuit, the delay stage 6a which receives the activated selecting signal SS (disable signal DIS) at the disable terminal is inactivated. The output level of the inactivated delayed stage 6a is fixed. Therefore, the inactivated delay stage 6a does not transmit the delay signal DT from the previous stage to the subsequent stage. In other words, the inactivated delay stage 6a and the delay stages 6a subsequent to this delay stage 6a stop their operations. Thereby, wasteful power consumption is avoided. Further, the unnecessary delay stages 6a are inactivated by utilizing the selecting signal SS used in the selector 4 so that the variable delay circuit with low power consumption can be easily structured.

Figure 3:
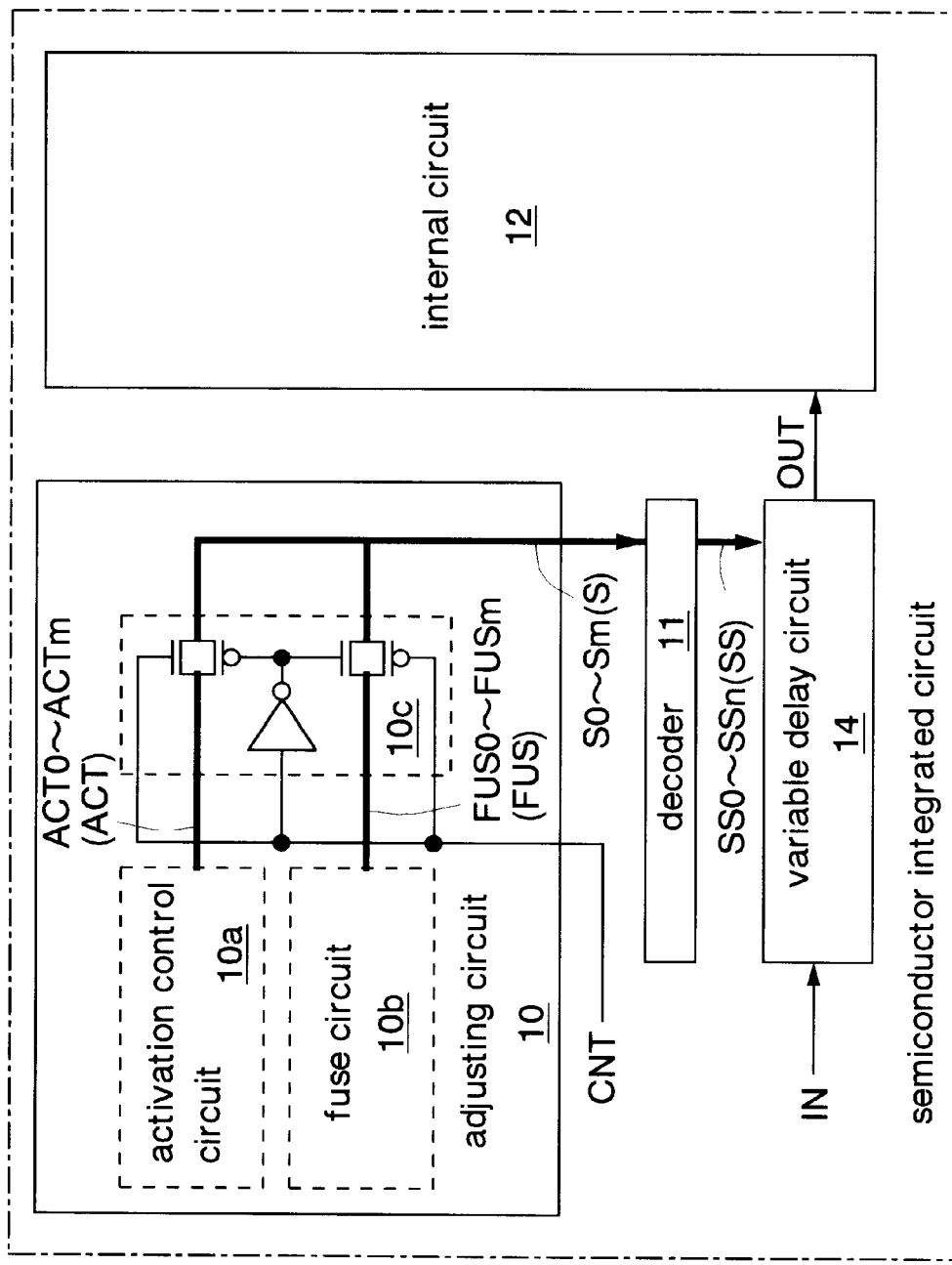
FIG. 3 is a block diagram showing a first embodiment of the variable delay circuit and a semiconductor integrated circuit having the variable delay circuit according to the present invention.

FIG. 3 shows a first embodiment of the variable delay circuit and a semiconductor integrated circuit having the variable delay circuit according to the present invention.

The semiconductor integrated circuit is formed as DRAM by, for example, using a CMOS process on a silicon substrate. The semiconductor integrated circuit has an adjusting circuit 10, a decoder 11, an internal circuit 12 having memory cells, a sense amplifier, and the like, a variable delay circuit 14, and a not-shown input/output circuit and a control circuit.

The adjusting circuit 10 has an activation control circuit 10a, a fuse circuit 10b and a plurality of selecting circuits 10c. The activation control circuit 10a is the circuit for controlling activation signals ACT0 to ACTm (hereinafter also referred to as the activation signal ACT collectively) by being controlled by the not-shown control circuit. A predetermined activation signal ACT is activated by a control signal (not shown). The fuse circuit 10b has a plurality of fuses (not shown) which are made of polysilicon or the like. The fuse circuit 10b is the circuit for controlling a plurality of fuse signals FUS0 to FUSm (hereinafter also referred to as the fuse signal FUS collectively) which correspond respectively to the activation signals ACT0 to ACTm, according to a blowout of the fuse like the above. It is impossible to inactivate the fuse signal FUS again which has been activated by blowing the fuse.

The plurality of selecting circuits 10c respectively receive the activation signals ACT0 to ACTm and the fuse signals FUS0 to FUSm, and output any of the activation signals ACT0 to ACTm or the fuse signals FUS0 to FUSm as selecting signals S0 to Sm (hereinafter also referred to as the selecting signal S collectively) by a control signal CNT. In other words, the selecting circuits 10c validate either an activation of the selecting signal by the activation control circuit 10a or an activation of the selecting signal by the fuse circuit 10b.

The decoder 11 receives the selecting signal S and activates any of selecting signals SS. The variable delay circuit 14 receives the input signal IN and the selecting signal SS and outputs the delayed output signal OUT which is generated by delaying the input signal IN by a predetermined time. In this embodiment, the delayed output signal OUT is used, for example, as a timing signal for activating the sense amplifier of the internal circuit 12. The sense amplifier is activated when the delayed output signal OUT is at the low level. Namely, the delayed output signal OUT is used according to negative logic.

Figure 4:
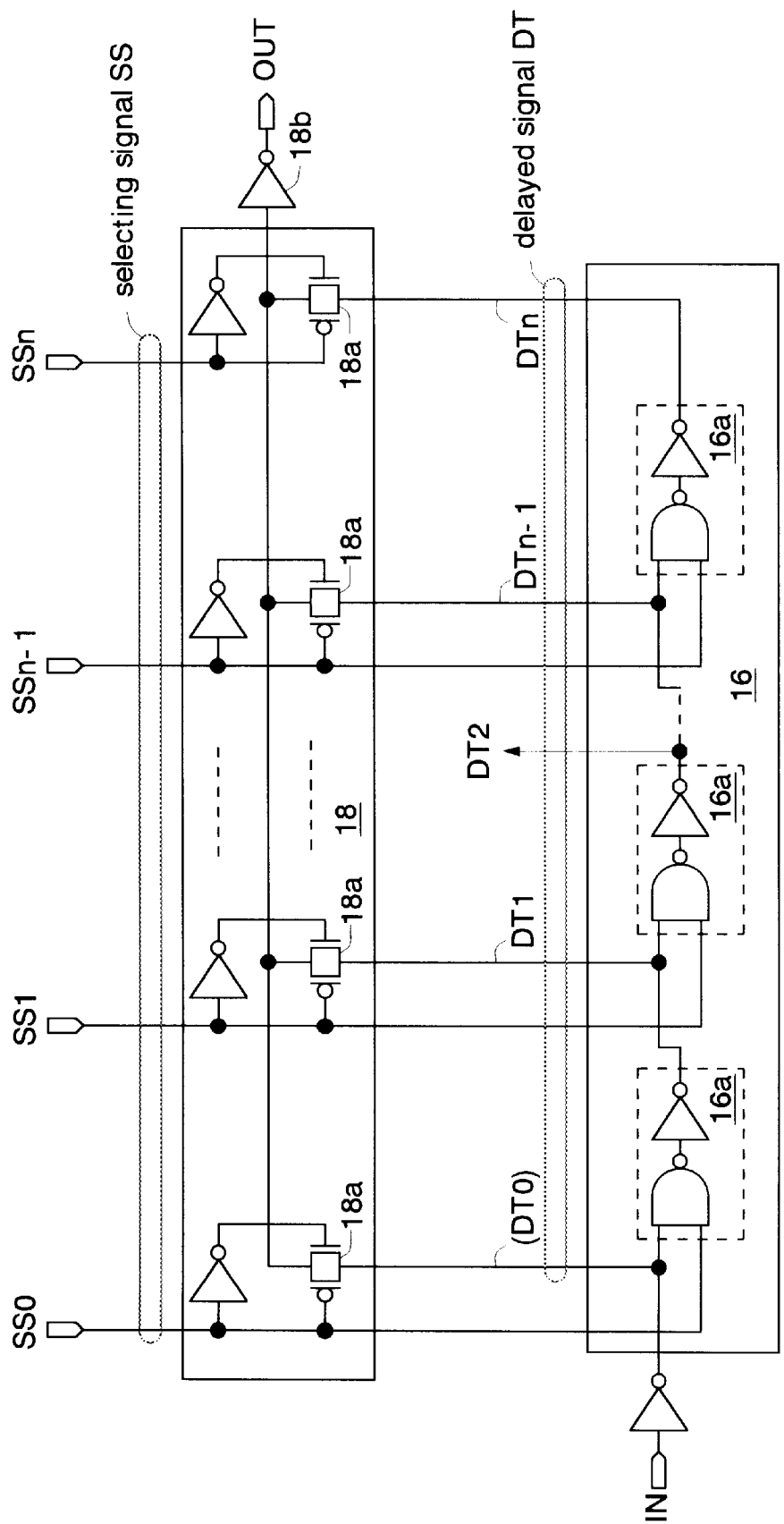
FIG. 4 is a block diagram showing the variable delay circuit of FIG. 3 in detail.

FIG. 4 shows the variable delay circuit 14 in detail.

The variable delay circuit 14 has a delay circuit 16 in which a plurality of delay stages 16a are connected in cascade and a selector 18.

The delay stage 16a of the delay circuit 16 is constructed of an AND circuit which consists of an NAND gate and an inverter. The delay circuit 16 receives an inverting signal of the input signal IN at the initial delay stage 16a, and outputs delayed signals DTT, DT2, . . . , DTn−1, DTn from the delay stages 16a, respectively. The respective delay stages 16a receive selecting signals SS0 to SSn−1 which correspond to the delayed signals DT0 to DTn−1 supplied from the previous stage at a disable terminal (an input of the NAND gates), respectively.

The selector 18 has a plurality of CMOS transmission gates 18a which correspond to the delayed signals DT, respectively. The CMOS transmission gates 18a respectively receive the delayed signals DT at one input/output terminals. The other input/output terminals of the CMOS transmission gates 18a are connected to each other, and to the inverter 18b. The CMOS transmission gates 18a are controlled by the selecting signals SS and the inverting signals of the selecting signals SS, are conducted when the selecting signals SS are at the low level. The inverter 18b outputs the received signals as the delayed output signal OUT.

Next, operations of the aforementioned circuit will be explained.

First, after the semiconductor integrated circuits are fabricated, an operation test is executed to a plurality of the semiconductor integrated circuits which are connected in a shape of a wafer. The activation control circuit 10a as shown in FIG. 3 activates the activation signals ACT0 to ACTm successively. At this moment, the fuse signal FUS is inactivated (low level). By activating (high level) the control signal CNT, the selecting circuits 10c output the activation signal ACT to the decoder 11 as the selecting signal. Receiving the selecting signal S, the decoder 11 activates any of the selecting signals SS.

As shown in FIG. 4, the CMOS transmission gate 18a which receives the activated selecting signal SS is turned on and transmits a predetermined delayed signal DT to the inverter 18b. The inverter 18b inverts the received delayed signal DT and outputs it as the delayed output signal OUT. For example, when the selecting signal SS1 is activated, the delayed signal DT1 which is delayed by a delay time of one delay stage 16a with respect to the input signal IN is outputted as the delayed output signal OUT.

In the delay circuit 16, the delay stage 16a is activated by receiving the inactivated selecting signal SS (high level) at the disable terminal. The delay stage 16a is inactivated by receiving the activated selecting signal SS (low level) at the disable terminal and keeps on outputting the delayed signal DT at the low level. That is, the output level of the inactivated delay stage 16a is fixed. For example, when the selecting signal SS1 is activated, the delay stage 16a which receives the delay signal DT1 is inactivated to output the delayed signal DT2 at the low level. The delay stage 16a which receives the delayed signal DT2 at the low level is inactivated to output the delayed signal DT3 (not shown) at the low level. As this result, the delay stage 16a which receives the activated selecting signal SS and the subsequent delay stages are inactivated to stop these operations. Actually, these keep on outputting the delayed signal DT at the low level. Since the delay stages 16a and the circuits which receive the output from the delay stages 16a are made of CMOS circuits, power consumption of the inactivated delay stages 16a becomes practically zero. Therefore, the power consumption of the variable delay circuit 14 is substantially decreased as compared with that of the prior art.

By performing the operation test, timing of the delayed output signal OUT at which the sense amplifier optimally operates (that is, the activation signal ACT to be activated at that moment) is determined. Then, the control signal CNT is inactivated (low level) during the operation of the semiconductor integrated circuit by blowing a predetermined fuse, so that the fuse signal FUS which corresponds to the above activation signal ACT is always activated and a predetermined selecting signal SS is always activated. Thereafter, by making the control signal CNT in the activation state (high level), the activation control circuit 10a is allowed to activate the optional selecting signal SS even after the blowout of the fuse. The delay stage 16a which receives the activated selecting signal SS and the subsequent stages thereto are inactivated to stop these operations, as described above. Therefore, power consumption of the variable delay circuit 14 is substantially decreased as compared with the prior art.

After the operation test, the semiconductor integrated circuits are assembled in package, and shipped after a final operation test is executed.

Incidentally, the inactivated delay stages 16a keep on outputting the delayed signals DT at the low level. Therefore, even when the CMOS transmission gate 18a which should be turned off is turned on due to power supply noise or the like, the delayed output signal OUT maintains the inactivated state (high level). Thereby, a malfunction of the sense amplifier due to the noise can be prevented.

As described above, in this embodiment, the delay stage 16a which is inactivated by the selecting signal SS and the subsequent delay stages 16a thereto stop their operations. Since the unnecessary delay stages 16a are not operated, wasteful power consumption can be avoided.

The delay stages 16a are inactivated by utilizing the selecting signals SS used in the selector 18. Therefore, the variable delay circuit with low power consumption can be easily structured.

The activation control circuit 10a for activating the predetermined selecting signal SS is provided. Thereby, the selecting signals are activated successively during the operation test so that an operational margin of the internal circuit 12 can be evaluated and optimal timing of the delayed output signal OUT can be evaluated.

The predetermined selecting signal SS is activated under the control of either the activation control circuit 10a or the fuse circuit 10b. Therefore, the predetermined fuse of the fuse circuit 10b is blown based on an evaluation of electric characteristics of the internal circuit 12, thereby allowing the delayed output signal OUT to be always outputted at an optimal timing.

Figure 5:
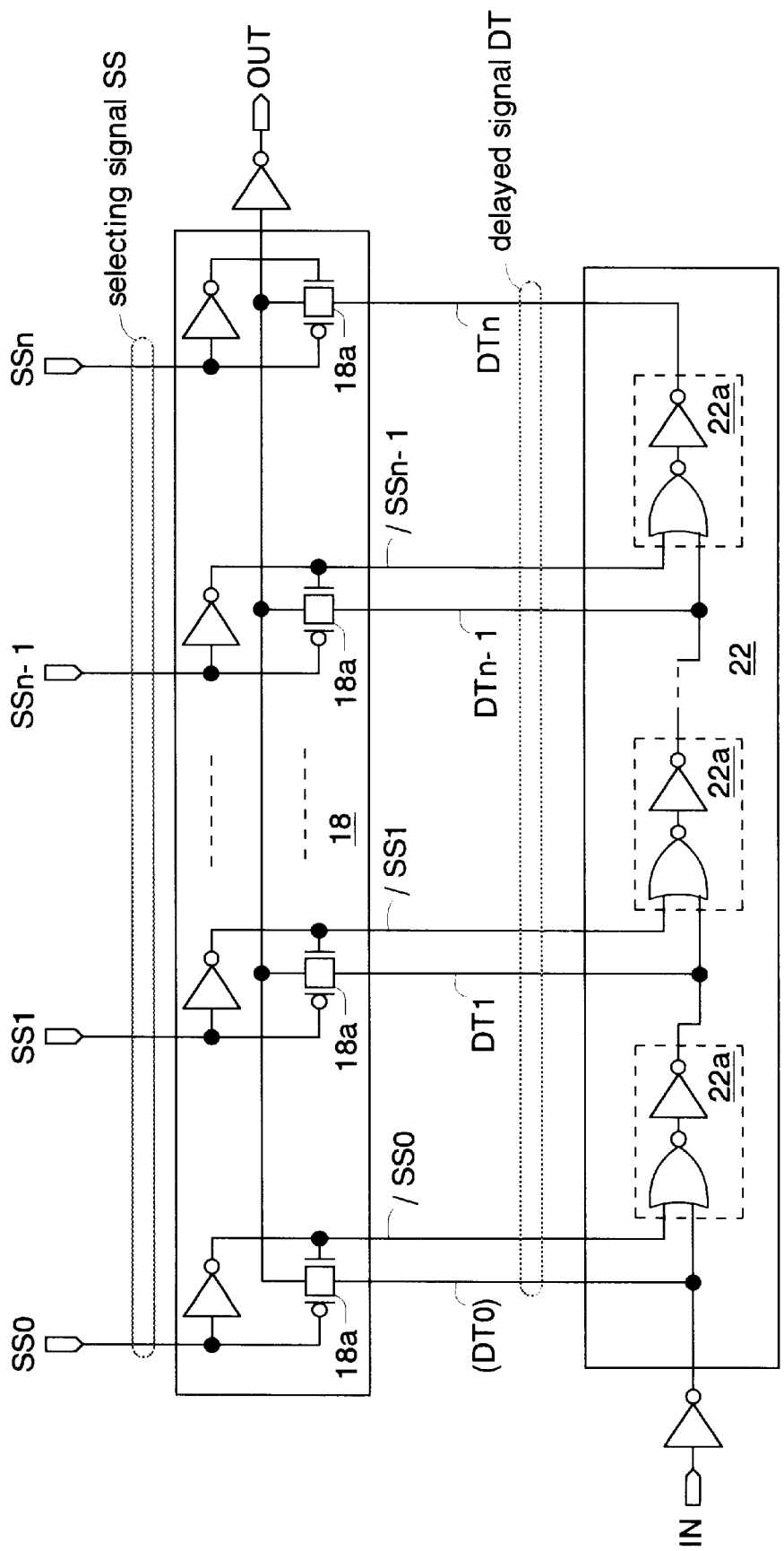
FIG. 5 is a block diagram showing a second embodiment of the variable delay circuit in detail.

FIG. 5 shows a second embodiment of the variable delay circuit according to the present invention. The same numerals are given to the same circuits/signals with the circuits/signals which are explained in the first embodiment, and detailed explanations thereof are omitted.

A delay circuit 22 which is formed in the variable delay circuit of this embodiment is different from that of the first embodiment. The rest of the structure is the same with that of the first embodiment.

The delay circuit 22 is structured by connecting a plurality of delay stages 22a in cascade. The delay stage 22a has an OR circuit which consists of a NOR gate and an inverter. The delay circuit 22 receives an inverting signal of an input signal IN at the initial delay stage 22a, and outputs delayed signals DT1, DT2, . . . , DTn−1, DTn from each of the delay stages 22a, respectively. The respective delay stages 22a receive inverting signals of selecting signals SS0 to SSn−1 which correspond to the delayed signals DT0 to DTn−1 supplied from the previous stage at a disable terminal (an input of the NOR gates), respectively.

Namely, in this embodiment, the delay stages 22a are inactivated by the activation (low level) of the selecting signals SS, and output the delayed signals DT at the high level. For this reason, a malfunction due to noise can be prevented when a delayed output signal OUT is used according to positive logic. That is, even when a CMOS transmission gate 18a which should be off is turned on due to power supply noise or the like, the delayed output signal OUT maintains the inactivated state (low level).

The same effects as those in the aforementioned first embodiment can be obtained with the variable delay circuit according to this embodiment.

Figure 6:
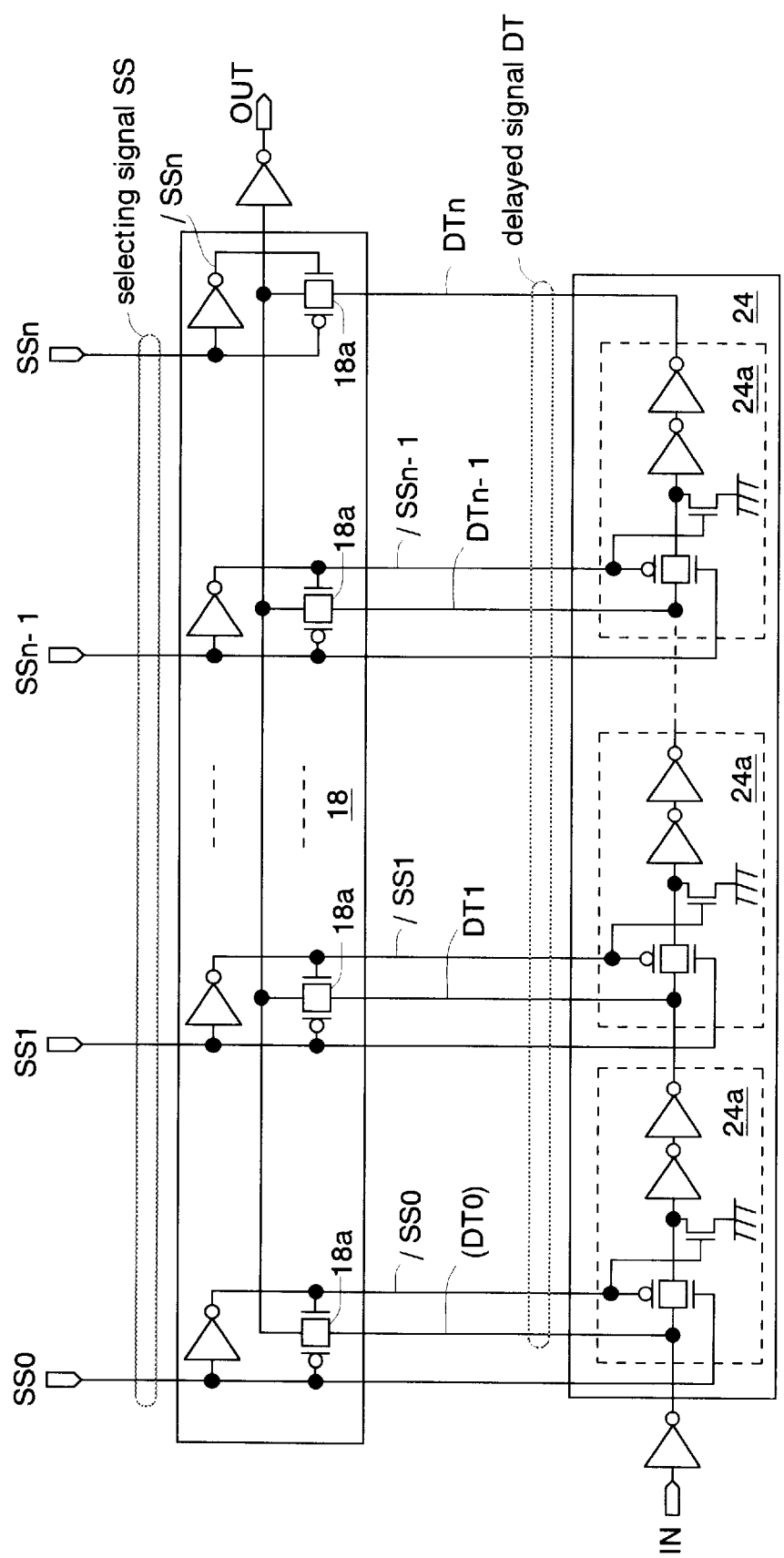
FIG. 6 is a block diagram showing a third embodiment of the variable delay circuit in detail.

FIG. 6 shows a third embodiment of the variable delay circuit according to the present invention. The same numerals are given to the same circuits/signals with the circuits/signals which are explained in the first embodiment, and detailed explanations thereof are omitted.

A delay circuit 24 which is formed in the variable delay circuit of this embodiment is different from that of the first embodiment. The rest of the structure is the same with that of the first embodiment.

The delay circuit 24 is structured by connecting a plurality of delay stages 24a in cascade. The delay circuit 24 receives an inverting signal of an input signal IN at the initial delay stage 24a and outputs delayed signals DT1, DT2, . . . , DTn−1, DTn from each of the delay stages 24a, respectively. The respective delay stages 24a receive selecting signals SS0 to SSn−1 which correspond to the delayed signals DT0 to DTn−1 supplied from the previous stage and inverting signals thereof /SS0 to /SSn−1, respectively.

Each delay stage 24a has a CMOS transmission gate, an inverter array which includes two inverters and an nMOS transistor. One input/output terminal of the CMOS transmission gate is connected to an input terminal and the other input/output terminal thereof is connected to an input terminal of the inverter array. The inverter array outputs the delayed signal DT. The nMOS transistor receives the inverting signal /SS of the selecting signal at the gate (disable terminal), connects a drain to the other input/output terminal of the CMOS transmission gate, and connects a source to a ground line. Inputs (disable terminals) of the CMOS transmission gate are controlled by the selecting signal SS (SS0 to SSn−1) and the inverting signal /SS (/SS0 to /SSn−1) of the selecting signal SS, and is conducted when the selecting signal SS is at the high level.

Namely, in this embodiment, the delay stages 24a which receive the activation of the selecting signals SS (low level) output the delayed signals DT at the low level by turning off the CMOS transmission gates and turning on the nMOS transistors. The rest of the operations are the same with those of the aforesaid first embodiment.

The same effects as those in the aforementioned first embodiment can be obtained with the variable delay circuit according to this embodiment.

Figure 7:
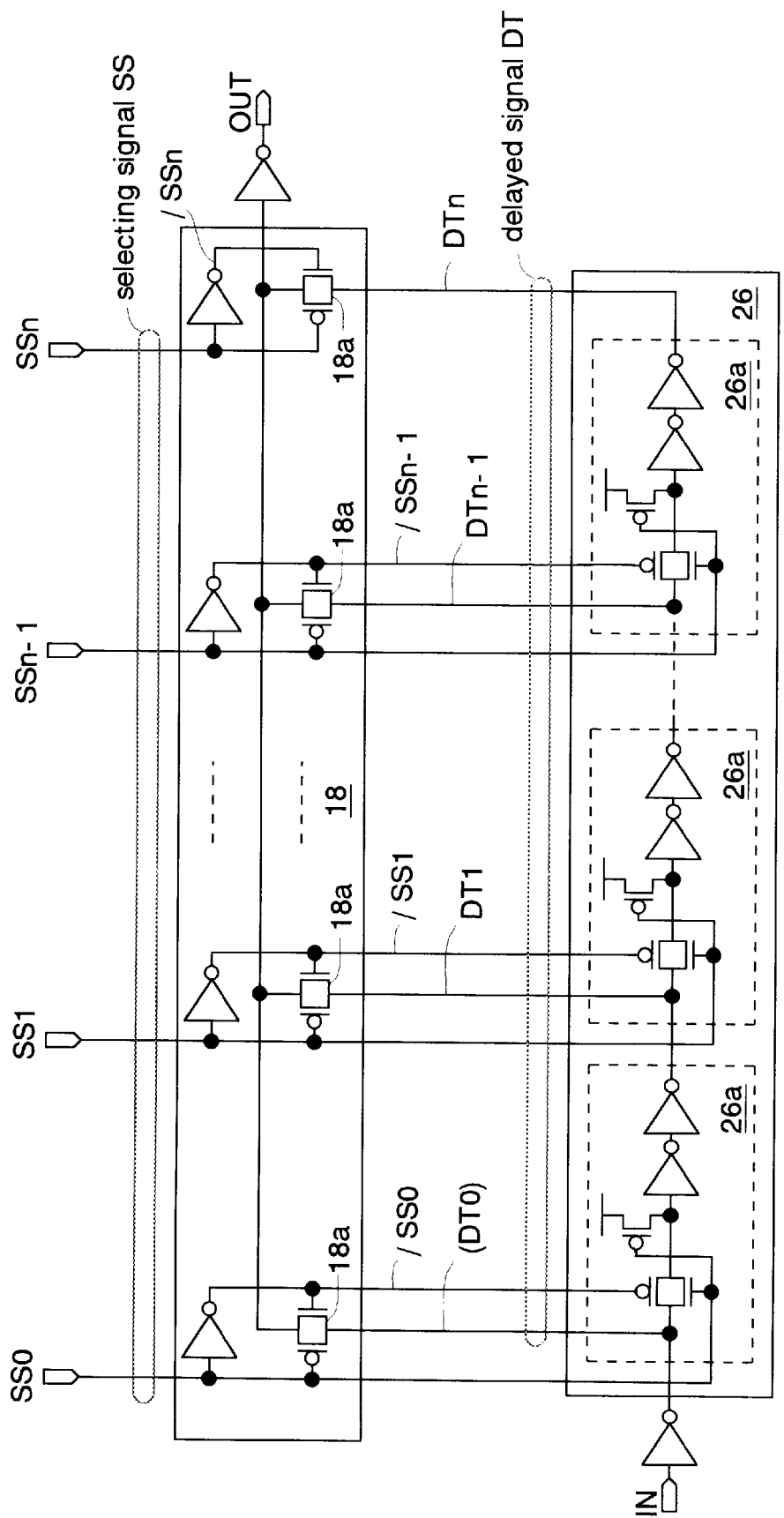
FIG. 7 is a block diagram showing a fourth embodiment of the variable delay circuit in detail.

FIG. 7 shows a fourth embodiment of the variable delay circuit according to the present invention. The same numerals are given to the same circuits/signals with the circuits/signals which are explained in the first and the third embodiments, and detailed explanations thereof are omitted.

A delay circuit 26 which is formed in the variable delay circuit of this embodiment is different from that of the third embodiment. The rest of the structure is the same with that of the third embodiment.

The delay circuit 26 is structured by connecting a plurality of delay stages 26a in cascade. The delay circuit 26 receives an inverting signal of an input signal IN at the initial delay stage 26a and outputs delayed signals DT1, DT2, . . . , DTn−1, DTn from each of the delay stages 26a, respectively. The respective delay stages 26a receive selecting signals SS0 to SSn−1 which correspond to the delayed signals DT0 to DTn−1 supplied from the previous stage and inverting signals thereof /SS0 to /SSn−1, respectively.

Each delay stage 26a has a CMOS transmission gate, an inverter array which comprises two inverters and a pMOS transistor. One input/output terminal of the CMOS transmission gate is connected to an input terminal and the other input/output terminal thereof is connected to an input terminal of the inverter array. The inverter array outputs the delayed signal DT. The pMOS transistor receives the selecting signal SS at the gate (disable terminal), connects a drain to the other input/output terminal of the CMOS transmission gate, and connects a source to a power supply line. Inputs (disable terminals) of the CMOS transmission gate are controlled by the selecting signal SS (SS0 to SSn−1) and the inverting signal /SS (SS0 to /SSn−1) of the selecting signal SS, and is conducted when the selecting signal SS is at the high level.

Namely, in this embodiment, the delay stages 26a which receive the activation of the selecting signals SS (low level) output the delayed signals DT at the high level by turning off the CMOS transmission gates and turning on the pMOS transistors. The rest of the operations are the same with those of the aforesaid first and second embodiments.

The same effects as those in the aforementioned first and second embodiments can be obtained with the variable delay circuit according to this embodiment.

Incidentally, in the above embodiments, the example in which the delayed output signal OUT is used as the timing signal for activating the sense amplifier is described. However, it should be noted that the present invention is not limited to these embodiments. For example, the delayed output signal OUT may be used as a timing signal for activating a ward line or a column line. Moreover, the variable delay circuit of the present invention may be used as a delay circuit of a clock signal of clock synchronous type DRAM (for example, SDRAM).

In the above-described embodiment, the example in which the present invention is applied to DRAM is described. However, the present invention is not limited to these embodiments. For example, the present invention may be applied to other semiconductor memory such as SRAM, microcomputer, logic LSI, or system LSI.

Further, the semiconductor fabrication process to which the present invention is applied is not limited to the CMOS process, but may be a Bi-CMOS process.

The invention is not limited to the above embodiments and various modifications may be made without departing from the spirit and the scope of the invention. Any improvement may be made in part or all of the components.

What is claimed is:

1. A variable delay circuit comprising:
    a plurality of delay stages, connected in cascade, receiving selecting signals for selecting one of the delay stages, the delay stages outputting delay signals having different delay values, each delay stage receiving a corresponding one of the selecting signals to output a corresponding one of the delay signals; and
    a selector receiving the delay signals for selecting and outputting one of the delay signals in response to the selecting signals,
    wherein said delay stage selected by the corresponding selecting signal outputs a signal having a fixed logic value in response to the corresponding selecting signal.

2. The variable delay circuit according to claim 1, wherein:
    said selector includes a plurality of switches receiving said delayed signals, respectively, and having their outputs connected to each other, in which one of said switches turns on in response to the activation of one of said corresponding selecting signals and outputs one of the received delayed signals as a delayed output signal; and
    wherein each of said selecting signals, which controls each of said delay stages, selects each of said switches supplied with the delayed signals received at each of the delay stages, respectively.

3. A semiconductor integrated circuit having a variable delay circuit, the variable delay circuit comprising:
    a plurality of delay stages, connected in cascade, receiving selecting signals for selecting one of the delay stages, the delay stages outputting delay signals having different delay values, each delay stage receiving a corresponding one of the selecting signals to output a corresponding one of the delay signals; and
    a selector receiving the delay signals for selecting and outputting one of the delay signals in response to the selecting signals,
    wherein said delay stage selected by the corresponding selecting signal outputs a signal having a fixed logic value in response to the corresponding selecting signal.

4. The semiconductor integrated circuit having a variable delay circuit according to claim 3, wherein:
    said selector includes a plurality of switches receiving said delayed signals, respectively, and having their outputs connected to each other, wherein one of said switches turns on in response to the activation of one of said selecting signals which corresponds to it and outputs one of the received delayed signals as a delayed output signal; and
    wherein each of said selecting signals, which controls said delay stages, selects said switches supplied with the delayed signals received at the delay stages.

5. The semiconductor integrated circuit having a variable delay circuit according to claim 3, further comprising:

an adjusting circuit having an activation control circuit for activating any of said selecting signals; and an internal circuit changing its operation timing in response to said delayed output signal, which said selector outputs.

6. The semiconductor integrated circuit having a variable delay circuit according to claim 5, said adjusting circuit comprising:

a fuse circuit for activating any of said selecting signals by programming a fuse; and a selecting circuit for validating one of an activation of any of said selecting signals by said activation control circuit and an activation of any of said selecting signals by said fuse circuit.

7. A semiconductor integrated circuit having a variable delay circuit, the variable delay circuit comprising:

a delay circuit having a plurality of delay stages connected in cascade for receiving an input signal at an initial delay stage and respectively outputting delayed signals, each of which the input signal delayed;

a selector for receiving said delayed signals and selecting signals corresponding to the delayed signals, selecting one of said delayed signals corresponding to one of said selecting signals, and outputting the selected delayed signal as a delayed output signal; and an adjusting circuit including an activation control circuit for activating any of said selecting signals, said adjusting circuit further comprising a fuse circuit for activating any of said selecting signals by programming a fuse, and a selecting circuit for validating one of an activation of any of said selecting signals by said activation control circuit and an activation of any of said selecting signals by said fuse circuit; and an internal circuit changing its operation timing in response to said delayed output signal which said selector outputs, wherein at least one delay stage on a subsequent side of the delay stage, which is among said delay stages outputting said delayed signals selected by the selector, has a fixed output level.

* * * * *